United States Patent [19]

George et al.

[11] 4,138,736
[45] Feb. 6, 1979

[54] ONE LEVEL SWITCH FOR MAGNETIC BUBBLE DOMAIN DEVICES

[75] Inventors: Peter K. George, Morgan Hill; Tsutomu Kobayashi, Placentia, both of Calif.

[73] Assignee: Rockwell International Corporation, El Segundo, Calif.

[21] Appl. No.: 820,079

[22] Filed: Jul. 28, 1977

[51] Int. Cl.² .............................................. G11C 19/08
[52] U.S. Cl. ........................................ 365/12; 365/15; 365/43
[58] Field of Search ...................... 365/12, 15, 16, 43, 365/39

[56] References Cited

U.S. PATENT DOCUMENTS

| | | | |
|---|---|---|---|
| 3,810,133 | 5/1974 | Bobeck et al. | 365/12 |
| 4,007,453 | 2/1977 | Bonyhard et al. | 365/12 |

*Primary Examiner*—James W. Moffitt
*Attorney, Agent, or Firm*—H. Fredrick Hamann; G. Donald Weber, Jr.

[57] ABSTRACT

There is provided a switch which is useful in magnetic bubble domain devices. The switch can be used to replicate, transfer or annihilate any bubble domains in a magnetic bubble domain system. The switch comprises a "BOOMERANG" shaped element which is disposed adjacent to two juxtaposed magnetic bubble domain propagation paths. A re-entrant current path conductor is integrally connected to the boomerang shaped element and associated with at least one of the propagation paths whereby magnetic bubble domains can be stretched, cut, annihilated or the like in response to a control current signal. Optional bar shaped elements are associated with various components of the switch in order to improve the operating characteristics of the switch.

10 Claims, 9 Drawing Figures

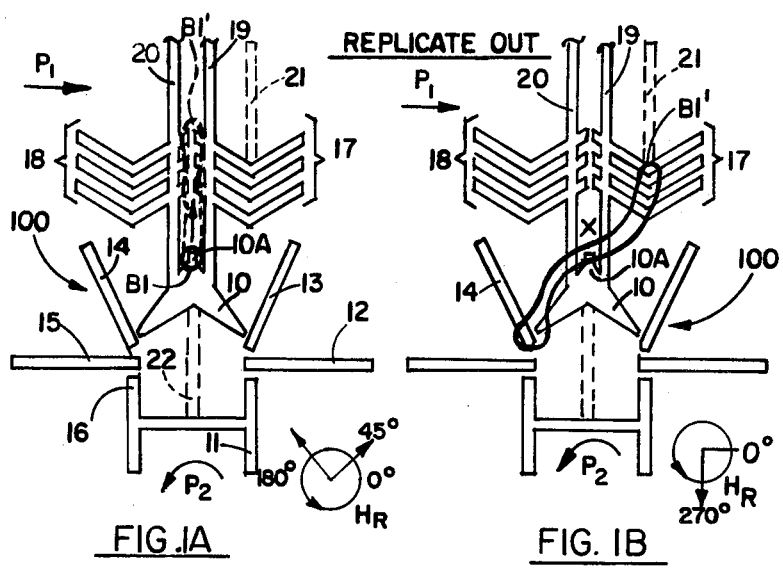
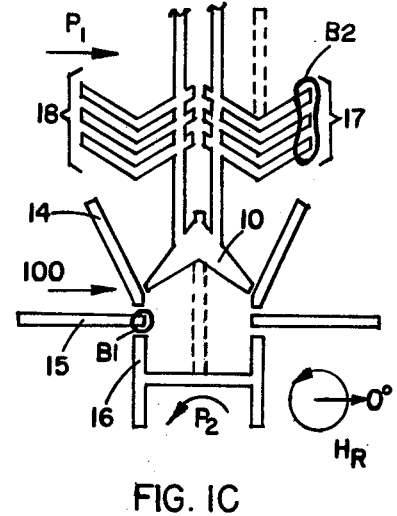
FIG. 1A     FIG. 1B     FIG. 1C
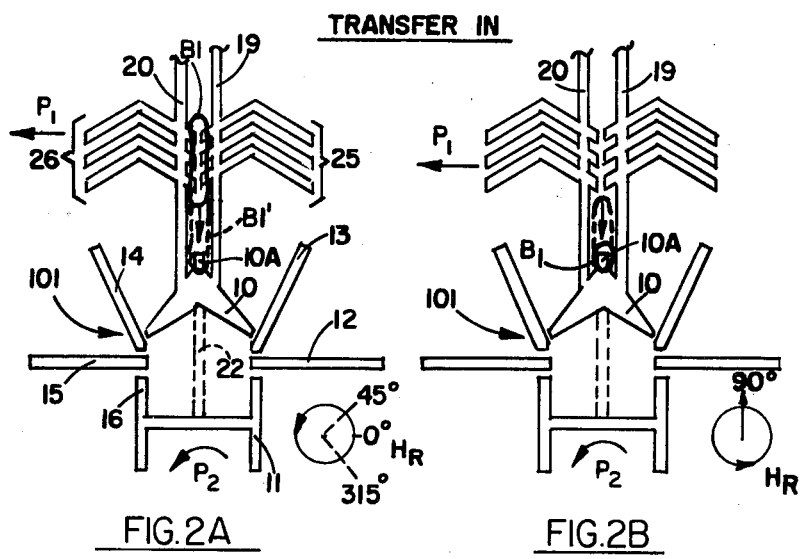
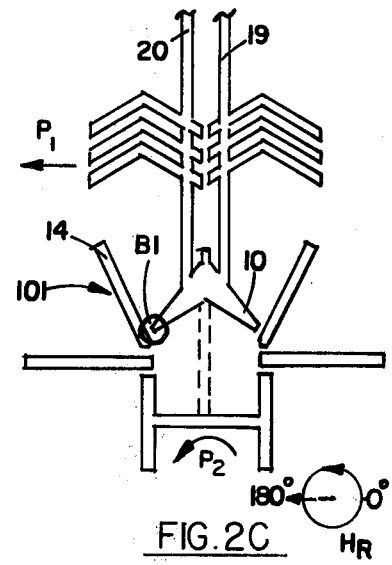
FIG. 2A     FIG. 2B     FIG. 2C
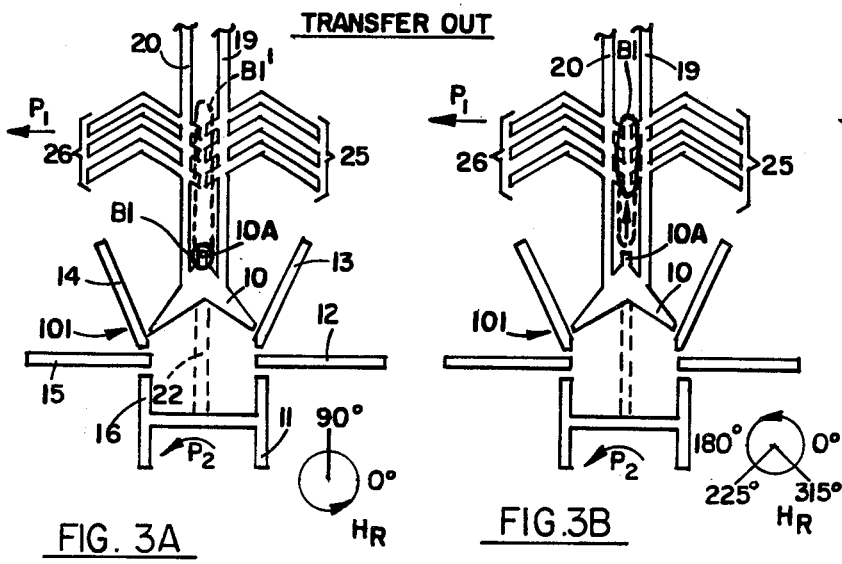
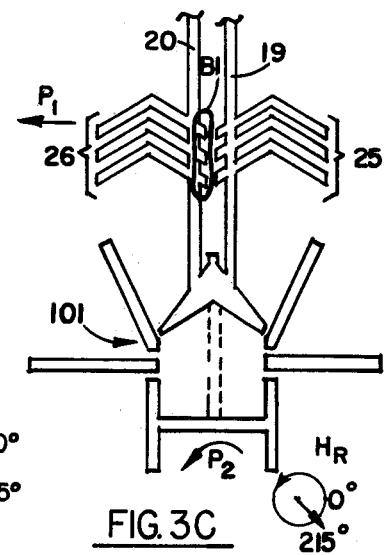
FIG. 3A     FIG. 3B     FIG. 3C

ONE LEVEL SWITCH FOR MAGNETIC BUBBLE DOMAIN DEVICES

BACKGROUND OF THE INVENTION

1. Field of the Invention

This invention is directed to magnetic bubble domain devices, in general, and to a one-level switch for use with magnetic bubble domain systems, in particular.

2. Prior Art

Magnetic bubble domain devices and systems are well known in the art. Currently, device, material and fabrication development is underway in order to improve operating characteristics of these bubble domain memory systems. These improvements are directed toward optimizing system organizations as well as toward increasing capacity (chip and memory) through the use of gap tolerant propagation structures and superior fabrication techniques. Improved fabrication techniques will permit greater densities of devices, greater reliability and simplification of the fabrication processes.

One area which is the subject of much examination is the use of one-level device components including switches. To data there are only two one-level switches known. One of these switches is reported by T. J. Nelson, AIP Conference Proceedings, No. 18, Part 1, pages 95-99 (1974). In this device, a pair of opposed chevron columns are interconnected by a conductor path which passes through the apices of the chevron columns. This switch has been shown to work reasonably well in either the transfer mode or the replicate mode. However, this switch is very difficult to use in a major-minor loop chip organization inasmuch as designing a current return path compatible with the chip layout is a significant problem. While it is proposed to provide the current return path by utilization of a second gross masking process for producing another conductor layer to provide the return path, the second masking process inevitably complicates the fabrication process (relative to a one mask process) thereby resulting in lower fabrication yield. Moreover, this approach is not significantly less complicated than a two level process.

A second one-level switch is proposed by Bobeck et al, IEEE Transactions Magnetics, MAG-9, pages 474-480 (1973). In this switch, oppositely directed chevron columns are offset one from another and a pair of conductors are interconnected therebetween, adjacent the ends of the respective chevron columns. While this switch has the advantage of having a current return path, it has been shown that the current required for stretching a bubble from one track to the other is far too high to be practical for a one level design. This is because the current applied to stretch a bubble from a minor loop to a major loop is divided into several paths (determined by the number of chevrons per column) thus weakening the field produced along the upper chevron. Reference is made to Kryder et al, IEEE Transactions on Magnetics. MAG-11, pages 1145-1147 (1975) for the analysis which has demonstrated the shortcomings of the Bobeck et al switch. Consequently, there are no one-level switches known in the art which are available for use in a major-minor loop chip organization.

SUMMARY OF THE INVENTION

There is shown a one-level magnetic bubble domain device switch which permits transfer, replication or annihilation of magnetic bubble domains. The switch is incorporated between two propagation paths with the basic element thereof included in one of the paths. The basic element, i.e., a boomerang shaped pattern does not introduce a significant timing delay or cause significant margin degradation in either the major or minor loop propagation paths. By adding optional magnetic bars, improved operation of the switch can be provided.

The conductor path associated with the boomerang shaped element passes through the major loop propagation path with virtual impunity thereby allowing ease of interconnection.

DESCRIPTION OF THE DRAWINGS

FIGS. 1A-1C show the switch of the instant invention as utilized in the replicate mode.

FIGS. 2A-2C show the operation of the switch of the instant invention in the transfer-in mode.

FIGS. 3A-3C show the switch of the instant invention operating in the transfer-out mode.

DESCRIPTION OF THE PREFERRED EMBODIMENT

Referring now to FIG. 1A, there is shown switch 100 which represents one embodiment of the instant invention. Relevant to switch 100, are two adjacent propagation paths P1 and P2, respectively. Propagation path P1 is represented by chevron columns 17 and 18 which form a portion of the major loop propagation path. Other chevron columns or similar components may be utilized in the remainder of the path. Propagation path P2 includes elements 11, 12, 13, 10, 14, 15 and 16. Elements 11 and 16 are portions of a single propagation component such as an H-shaped element. However, of course, separate and alternative components be utilized in the minor loop.

The particular component of interest is component 10 which is a "boomerang-shaped" element. In essence, element 10 is similar to an enlarged chevron having a substantially wider dimension at the apex than at the ends thereof. In addition, in a preferred embodiment, a nose 10A projects from the apex of element 10. Conductors 19 and 20 pass through the adjacent ends of chevron columns 17 and 18 respectively and join with the sides of element 10. The juncture of the conductors 19 and 20 with element 10 are spaced somewhat from the apex or nose 10a of element 10. Typically, conductors 19 and 20 are spaced apart by a distance greater than the diameter of the bubble domain utilized in the chip.

In addition, bar elements 21 and 22 (shown dashed) are optional elements which may be included in the switching apparatus in order to optimize operation thereof, if desired. However, bar elements 21 and 22 are not believed necessary to provide ordinary operation of the switch.

For completeness it should be noted that the elements shown in FIG. 1A (and other figures herein) represent the permalloy or similar material pattern defined on a magnetic bubble domain layer (not shown) as is well known in the art. In addition, the bias and rotating fields $H_B$ and $H_R$ respectively are applied in the usual manner.

Referring now to FIGS. 1A, 1B and 1C concurrently, the operation of switch 100 in the replicate mode is described. As shown, a "replicate-out" operation is depicted. That is, a bubble propagating along path P2 (for example a minor loop) is replicated out to a major loop represented by propagation path P1. In this mode, a bubble has propagated in path P2 in the usual manner and has been received at the apex 10A of element 10. At this time, field $H_R$ is between approximately the 45°-90° position as shown in FIG. 1A. At approximately this time, a signal is applied to the current path defined by conductors 19 and 20 such that current is produced therein. This current produces a magnetic field around conductors 19 and 20 which tends to cause bubble B1 at the apex 10A of element 10 to stretch toward the ends of chevron columns 17 and 18. In addition, as rotating field $H_R$ rotates toward the 90° position, the ends of chevron columns 17 and 18 become attractive magnetic poles which further cause bubble B1 to stretch, as shown by dotted line B1', so that the bubble extends from nose 10A to the ends of chevron columns 17 and 18. Of course, as field $H_R$ continues to rotate, the attractive magnetic poles of the chevrons move to the left ends of chevrons 17 and bubble B1 is attracted thereto. However, bubble B1 is still attracted to nose 10A of element 10 as shown by the dashed outline of bubble B1'. At approximately the 135° to 180° position of $H_R$, the current on conductors 19 and 20 is terminated. However, bubble B1', i.e. the extended bubble, remains.

As rotating field $H_R$ continues to rotate toward the 270° position, extended bubble B1' extends from the apex of chevron column 17 through (or near) nose 10A to the left end of element 10. At approximately the 270° position of rotating field $H_R$ a very short spike-like pulse of current is applied to conductors 19 and 20 to produce a magnetic field. This magnetic field, when approximately chosen, acts to sever bubble B1' at the location indicated by X. When extended bubble B1' is cut the bubble portion at the apex of chevron column 17 snaps into a single elongated bubble at that location while the lower bubble portion collapses into a substantially cylindrical bubble at the left end of element 10 or at the bottom of element 14 depending upon the specific position of field $H_R$ at the time.

As the field $H_R$ continues to rotate around toward the 0° through 45° position, the severed bubbles continue to propagate through the pattern. In otherwords, the original bubble B1 continues to propagate through path P2 while the newly replicated bubble B2 is disposed at the right end of chevron column 17. Thus, it is seen that two bubbles have been formed from the single bubble, i.e. bubble B1, which was originally present. These bubbles now propagate through path P1 and P2 independently of each other.

Referring now to FIG. 2A, there is shown another embodiment of the instant invention. The embodiment shown in FIG. 2A is substantially similar to the embodiment shown in FIG. 1A with the exception of the arrangement of the chevron columns. That is, chevron columns 25 and 26 have the apices thereof pointing in the opposite direction relative to columns 17 and 18 in FIG. 1A. Other elements in the embodiments are substantially the same and are represented by similar reference numerals.

Referring now to FIGS. 2A, 2B, and 2C, concurrently, the transfer-in mode of operation is described. In the transfer-in mode, it is assumed that a bubble propagating through path P1 is to be transferred to path P2. Propagation through path P1 is similar to the usual operation. Thus, when field $H_R$ achieves the 315° position, bubble B1 is located at the right ends of chevron column 26. Shortly thereafter, a current signal is supplied to the conductors 19 and 20 to provide a magnetic field which efffectively blocks bubble B1 from progressing past conductor 19. In addition, the field causes bubble B1 to stretch toward nose 10A in element 10 as indicated by bubble B1' (shown dashed). The stretched or elongated bubble is affectively trapped between conductors 19 and 20 as field $H_R$ continues to rotate. When field $H_R$ reaches the 90° position, nose 10A provides a strong magnetic pole which effectively attracts the bubble so that a substantially cylindrical bubble B1 is located at nose 10A. The attraction at this pole as well as the repulsion from the chevron poles causes bubble B1 to shrink as suggested by the arrow in the dashed outline. As soon as bubble B1 has been attracted to nose 10A, the current in conductors 19 and 20 is terminated so that bubble B1 can then pass beyond the conductors into the minor loop in normal response to field $H_R$. Consequently, as the field $H_R$ rotates through the 180° position toward the 225° position, bubble B1 moves to the left end of element 10 and from there to the bottom of element 14 and so forth. Thus, a bubble has been transferred from path P1 into path P2.

Referring now to FIGS. 3A, 3B, and 3C there is described a transfer-out mode of operation for the embodiment of switch 101 which is similar to the switch shown in FIG. 2A. Again, similar components bear similar reference numerals. However, in this mode of operation, a bubble is transferred out of path P2 into path P1. In this instance, bubble B1 is propagated through elements 11, 12, 13 and is received at element 10. When field $H_R$ reaches the 90° position, bubble B1 rests at nose 10A of element 10. After this position is achieved, a control signal is supplied to conductors 19 and 20. Again, this signal is of appropriate magnitude, duration and the like to cause bubble B1 to stretch out along the conductors as shown by dashed outline B1' in FIGS. 3A and 3B. The elongated bubble overlaps and engages the ends of chevron columns 25 and 26 between conductors 19 and 20.

As field $H_R$ reaches the approximately 225° position, the left ends of chevron column 25 become strong magnetic poles which cause bubble B1 to be attracted thereto and away from nose 10A. Shortly thereafter, the control signal on conductors 19 and 20 is terminated and bubble B1 shrinks to the size indicated in FIG. 3B at the ends of chevron column 25. As field $H_R$ continues to rotate toward the 315° position, bubble B1 moves to the right end of chevron column 26 in the usual fashion. Thus, a bubble has been transferred out of path P2 to path P1.

Thus, there has been shown and described a one-level switch wherein a conductor is integrally formed in the same pattern as the propagation path elements of a magnetic bubble domain device. The conductors are contiguous with and integrated with the compounds in each of the propagation paths. This one-level switch permits single level fabrication, can easily be interconnected and does not require impractically high switching currents. The description of the device is meant to be illustrative only and not to be limitative. The scope of the invention is limited only by the claims appended hereto.

Having thus described a preferred embodiment of the invention, what is claimed is:

1. A one-level switch for magnetic bubble domain devices comprising, first and second propagation paths adjacent to each other, a transfer element included in said first propagation path and adjacent said second propagation path, and said transfer element includes two arms joined together at approximately a 90° angle to each other, each of said arms of said transfer element taper to a narrower dimension at the free ends thereof, a pair of conductor elements integrally formed with said transfer element and components in said second propagation path to permit current signals to be applied relative to said first and second propagation paths so that magnetic bubble domains can interact between said first and second propagation paths.

2. The switch recited in claim 1 wherein said conductor elements intersect with respective arms of said transfer element intermediate the length of said arms.

3. The switch recited in claim 1 wherein:
said transfer element includes a projection from the apex of the angle formed by the two arms thereof.

4. The switch recited in claim 1 wherein said transfer element has boomerang-like configuration.

5. The switch recited in claim 1 including:
a bar attached to the inner side of said angle to provide an improved magnetic pole at said angle.

6. The switch recited in claim 1 wherein:
said second propagation path comprises columns of chevrons which are the components integrally formed with said conductor elements.

7. The switch recited in claim 6 wherein:
said switch performs transfer or replicate operations as a function of the position of said chevron columns.

8. The switch recited in claim 6 wherein said columns of chevrons and said transfer element have the apices thereof pointing in the same direction.

9. The switch recited in claim 6 wherein said columns of chevrons are offset from said transfer element.

10. The switch recited in claim 1 wherein:
said pair of conductor elements are connected in series via said transfer element.

* * * * *